(12) United States Patent
Lee

(10) Patent No.: US 8,476,767 B2
(45) Date of Patent: Jul. 2, 2013

(54) STACKED LAYER TYPE SEMICONDUCTOR DEVICE

(75) Inventor: Ho Cheol Lee, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 271 days.

(21) Appl. No.: 12/762,615

(22) Filed: Apr. 19, 2010

(65) Prior Publication Data

US 2010/0314772 A1     Dec. 16, 2010

(30) Foreign Application Priority Data

Jun. 16, 2009 (KR) ........................ 10-2009-0053550

(51) Int. Cl.
*H01L 23/48* (2006.01)

(52) U.S. Cl.
USPC ..... 257/773; 257/686; 257/202; 257/E23.011

(58) Field of Classification Search
USPC .................................................. 257/202–208
See application file for complete search history.

(56) References Cited

U.S. PATENT DOCUMENTS

| 6,624,506 B2 | 9/2003 | Sasaki et al. |
| 7,352,067 B2 | 4/2008 | Fukaishi et al. |
| 2010/0095168 A1 * | 4/2010 | Jeddeloh ....................... 714/720 |

FOREIGN PATENT DOCUMENTS

| JP | 2001-307057 | 11/2001 |
| JP | 2006-019328 | 1/2006 |
| JP | 2006-165073 | 6/2006 |
| KR | 10-0438883 | 6/2004 |

OTHER PUBLICATIONS

English Abstract for Publication No. 1020010098740 (for 10-0438883).
English Abstract for Publication No. 2001-307057.
English Abstract for Publication No. 2006-019328.
English Abstract for Publication No. 2006-165073.

* cited by examiner

*Primary Examiner* — Thanh Nguyen
(74) *Attorney, Agent, or Firm* — F. Chau & Associates, LLC

(57) ABSTRACT

A stacked layer type semiconductor device includes N memories each including at least one main via and (N−1) sub vias, the N memories being sequentially stacked on one-another so that central axes of the N memories face each other crosswise, and a plurality of connection units electrically connecting the N memories. Here, N is a natural number greater than 1.

10 Claims, 7 Drawing Sheets

STACKED LAYER TYPE SEMICONDUCTOR DEVICE

CROSS-REFERENCE TO RELATED APPLICATIONS

This application claims priority under 35 U.S.C. §119 to Korean Patent Application No. 10-2009-0053550, filed on Jun. 16, 2009, in the Korean Intellectual Property Office, the disclosure of which is herein incorporated by reference in its entirety.

BACKGROUND

1. Technical Field

The present invention relates to stacked layer type semiconductor devices, and more particularly, to a stacked layer type semiconductor device having an increased processing speed, and a semiconductor system including the stacked layer type semiconductor device.

2. Description of Related Art

Semiconductor integrated circuits, for example, memory packaging technology, have been continuously developed to satisfy needs for memory miniaturization and packing efficiency. With the need for miniaturization and high performance of electric/electronic products, various techniques of stacking memories are being developed. The memory stacking denotes a technique of stacking at least two memories, one over another. The stacked memories may realize products with memory capacities twice as great as those of single-layered memories, and increase the geometric efficiency of an area on which memories are mounted.

In a conventional stacked memory, a plurality of memories are stacked on a circuit board by using an adhesion means such as adhesive, and each of the memories are electrically connected to the circuit board via a connection means such as a wire. The stacked memories and the circuit board may be packaged by a sealant such as Epoxy Molding Compound (EMC). Solder balls or connection pins that allow a package, namely, a circuit board, to be connected to an external circuit may be attached to a lower portion of the package, namely, the circuit board.

However, the memories of the convention stacked memory are connected to one another via wires. This structure may decrease the signal processing speed of stacked memory. In addition, since an additional area for wire bonding is required, the size of stacked memory increases.

SUMMARY

According to an exemplary embodiment of the present invention, a stacked layer type semiconductor device includes N memories each comprising at least one main via and (N−1) sub vias, the N memories being sequentially stacked on one-another so that central axes of the N memories face each other crosswise, wherein N is a natural number greater than 1, and a plurality of connection terminals electrically connecting the N memories.

According to another exemplary embodiment of the present invention, a stacked layer type semiconductor device includes a first memory comprising a first main via, a first sub via, and a first buffer electrically connected to the first main via and the first sub via, a second memory stacked on the first memory, and comprising a second main via electrically connected to the first main via, a second sub via electrically connected to the first sub via, and a second buffer electrically connected to the second main via and the second sub via, and at least one selection circuit for applying an access signal received from an external source to the first buffer and the second buffer along different paths at substantially the same time.

According to another exemplary embodiment of the present invention, a stacked layer type semiconductor device includes a first memory comprising a first main via, a first sub via, a first buffer electrically connected to the first main via, and a second buffer electrically connected to the first sub via, and a second memory stacked on the first memory, and comprising a second main via electrically connected to the first main via, a second sub via electrically connected to the first sub via, a third buffer electrically connected to the second main via, and a fourth buffer electrically connected to the second sub via. Each of the first memory and the second memory includes at least one selection applying an access signal received from an external source to the first or second buffer and to the third buffer or the fourth buffer along different paths at substantially the same time.

According to another exemplary embodiment of the present invention, a semiconductor system includes a central processing unit (CPU) for outputting an access signal, and a stacked layer type semiconductor device for performing an access operation according to the access signal provided from the CPU.

BRIEF DESCRIPTION OF THE DRAWINGS

Exemplary embodiments of the present invention will be more clearly understood from the following detailed description taken in conjunction with the accompanying drawings in which.

DETAILED DESCRIPTION OF EXEMPLARY EMBODIMENTS

Figure 1:
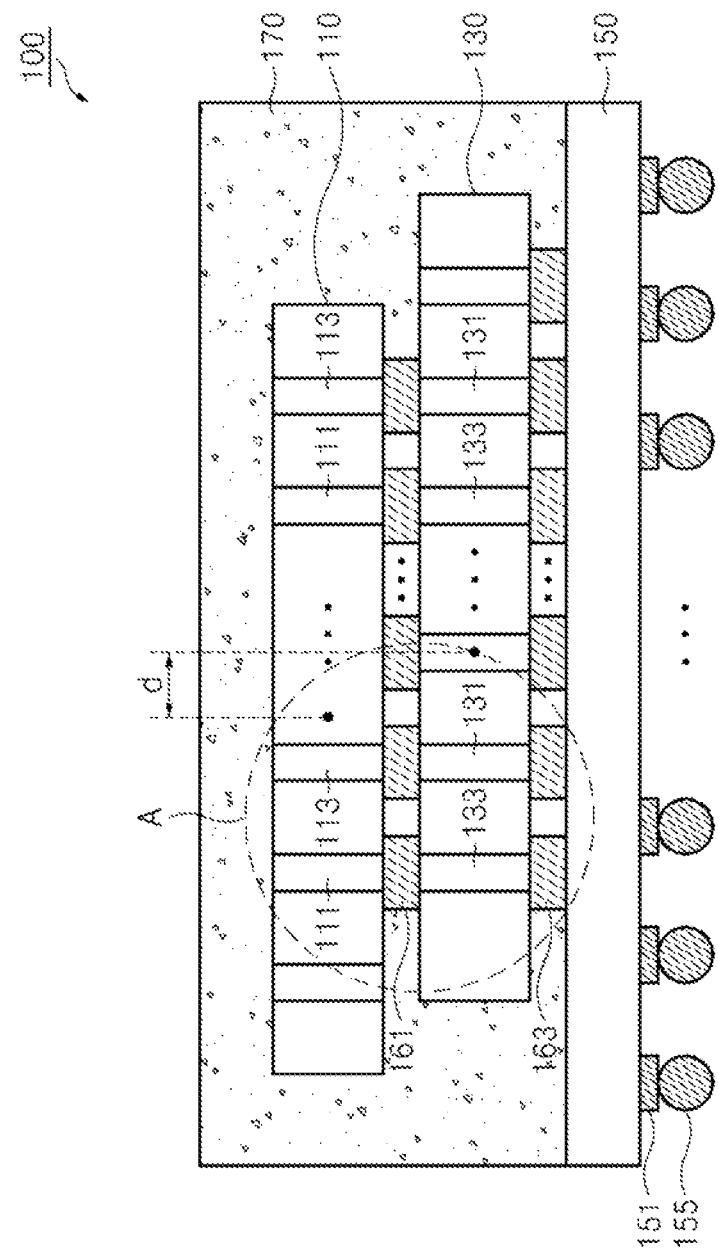
FIG. 1 is a schematic cross-sectional view of a stacked layer type semiconductor device according to an exemplary embodiment of the present invention.
Figure 2:
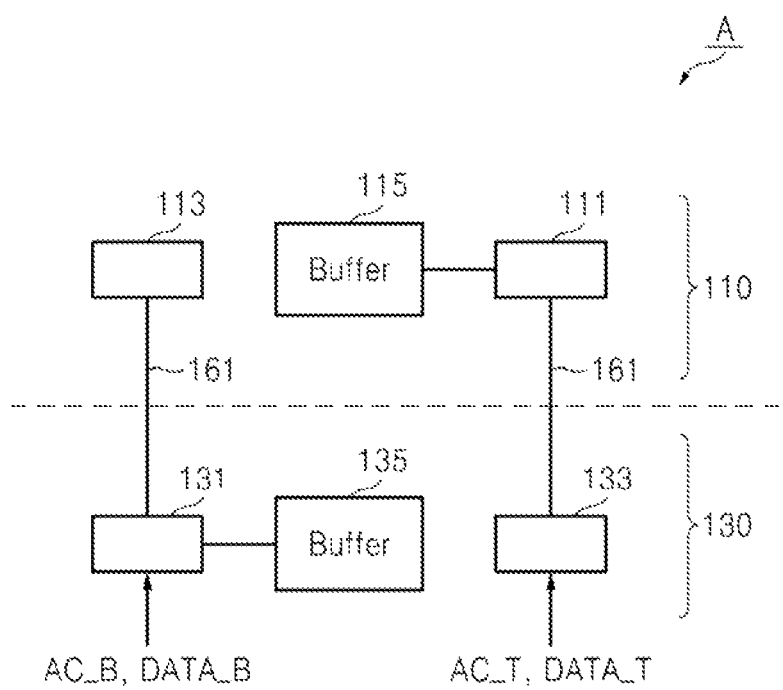
FIG. 2 is a schematic block diagram of a portion A of the stacked layer type semiconductor device illustrated in FIG. 1.

FIG. 1 is a schematic cross-sectional view of a stacked layer type semiconductor device 100 according to an exemplary embodiment of the present invention. FIG. 2 is a schematic block diagram of a portion A of the stacked layer type semiconductor device 100 of FIG. 1. According to an exemplary embodiment embodiment, a memory device in which two memories are sequentially stacked is illustrated as the stacked layer type semiconductor device 100. However, the present invention is not limited thereto. For example, the stacked layer type semiconductor device 100 may be a memory device in which N (where N is a natural number greater than 1) memories are sequentially stacked.

Referring to FIG. 1, the stacked layer type semiconductor device 100 may include a printed circuit board (PCB) 150, a first memory 110, and a second memory 130. The first memory 110 and the second memory 130 may be volatile memories or non-volatile memories. For example, the first memory 110 and the second memory 130 may be volatile memories such as Dynamic Random Access Memories (DRAMs), Static Random Access Memories (SRAMs), SDRAMs, or Rambus DRAMs (RDRAMs). These exemplary volatile memories are not intended to be limiting; other volatile memories may be implemented.

Each of the first memory 110 and the second memory 130 may be non-volatile memories such as EEPROMs, flash memories, Magnetic RAMs (MRAMs), Spin-Transfer Torque MRAMs, Conductive bridging RAMs (CBRAMs), Ferroelectric RAMs (FeRAMs), Phase change RAMs (PRAMs), Resistive RAMs (RRAMs or ReRAMs), Nanotube RRAMs, Polymer RAM (PoRAMs), Nano Floating Gate Memories (NFGMs), holographic memories, Molecular Electronics Memory Devices, or Insulator Resistance Change Memories. These exemplary non-volatile memories are not intended to be limiting; other non-volatile memories may be implemented.

The PCB 150 may be located in a lower portion of the stacked layer type semiconductor device 100, for example, below the second memory 130, and may be connected (or mounted) to (or on) the outside, for example, an external PCB (not shown). Although the PCB 150 is shown located below the second memory 130, the location of the PCB 150 is not limited thereto. For example, a chip set (not shown) may be located below the second memory 130. The first and second memories 110 and 130, which are stacked on over another, may be connected to the outside via the chip set.

At least one wiring pattern (not shown) may be formed on the PCB 150. A plurality of external connection (or mounting) units, for example, a plurality of solder balls 155, may be located below the wiring pattern, that is, below the PCB 150. The solder balls 155 may be connected to the PCB 150 via a plurality of third connection terminals 151.

The PCB 150 may receive and transmit signals from and to the outside via the solder balls 155. Although the solder balls 155 are illustrated as the external connection units of the stacked layer type semiconductor device 100, the present invention is not limited thereto. For example, the stacked layer type semiconductor device 100 may include a plurality of connection pins (not shown) as the external connection units.

The first memory 110 and the second memory 130 may be sequentially stacked on the PCB 150. An example in which the second memory 130 is located over the PCB 150 and the first memory 110 is stacked on the second memory 130 is illustrated in FIG. 1.

Each of the first memory 110 and the second memory 130 may include a plurality of vias. The vias of the first and second memories 110 and 130 may be Through Silicon Vias (TSVs).

The vias of the first memory 110 may include first vias 111 and second vias 113. The first vias 111 may be main vias. One end of each of the first vias 111 may be connected to a buffer 115 (see FIG. 2) of the first memory 110, and the other end of the first vias 111 may be connected to one end of the second memory 130. The second vias 113 may be sub vias, and the other end of each of the second vias 113 may be connected to the second memory 130.

The vias of the second memory 130 may include third vias 131 and fourth vias 133. The third vias 131 may be main vias. One end of each of the third vias 131 may be connected to each of the second vias 113 of the first memory 110 and a buffer 135 (see FIG. 2) of the second memory 130, and the other end of the third vias 131 may be connected to the PCB 150. The fourth vias 133 may be sub vias. One end of each of the fourth vias 133 may be connected to each of the first vias 111 of the first memory 110, and the other end of the fourth vias 133 may be connected to the PCB 150.

The first vias 111 and the second vias 113 of the first memory 110 may be connected to the third vias 131 and the fourth vias 133 of the second memory 130 via a plurality of connection terminals, for example, a plurality of first connection terminals 161. The third vias 131 and the fourth vias 133 of the second memory 130 may be connected to the PCB 150 via a plurality of second connection terminals 163.

The first and second connection terminals 161 and 163 may be metal bumps or solder balls. In some cases, the first and second connection terminals 161 and 163 may be Anisotropic Conductive Films (ACFs).

The first vias 111 and the second vias 113 of the first memory 110 may be connected to the third vias 131 and the fourth vias 133 of the second memory 130 so as to face each other crosswise. For example, the first memory 110 and the second memory 130 may be stacked so that their central axes face each other crosswise. Thus, the first vias 111 of the first memory 110 may be connected to the fourth vias 133 of the second memory 130, and the second vias 113 of the first memory 110 may be connected to the third vias 131 of the second memory 130.

Referring to FIGS. 1 and 2, the first memory 110 and the second memory 130 may further include the buffers 115 and the buffers 135, respectively. For example, the first memory 110 may include the buffers 115, namely, first buffers 115, connected to the first vias 111, and the second memory 130 may include the buffers 135, namely, second buffers 135, connected to the third vias 131.

The first buffers 115 and the second buffers 135 may be buffers to which access signals AC_B or AC_T are input from an external source via units. For example, the first buffers 115 and the second buffers 135 may be buffers for performing read/write operations of the first memory 110 and the second memory 130, respectively, according to the access signals AC_B or AC_T received from the external source. According to an exemplary embodiment, the first buffers 115 and the second buffers 135 are write buffers for writing data signals DATA_B or DATA_T received together with the access signals AC_B or AC_T from the external source according to the access signals AC_B or AC_T.

The third vias 131 and the fourth vias 133 of the second memory 130 may receive the data signals DATA_B or DATA_T together with the access signals AC_B or AC_T from the external source via the PCB 150. For example, the third vias 131 of the second memory 130 may receive the data signals DATA_B, namely, first data signals DATA_B, together with the access signals AC_B, namely, first access signals AC_B, via the PCB 150, and the fourth vias 133 thereof may receive the data signals DATA_T, namely, second data signals DATA_T, together with the access signals AC_T, namely, second access signals AC_T, via the PCB 150.

The first data signals DATA_B may be data signals input to the second buffers 135 of the second memory 130, and the second data signals DATA_T may be data signals input to the first buffers 115 of the first memory 110.

The first vias 111 of the first memory 110 may be connected to the fourth vias 133 of the second memory 130 via the first connection terminals 161, and the second vias 113 of the first memory 110 may be connected to the third vias 131 of the second memory 130 via the first connection terminals 161. Thus, the first access signals AC_B and the first data signals DATA_B may be input to the second buffers 135 of the second memory 130 via the PCB 150 and the third vias 131 of the second memory 130. The second access signals AC_T and the second data signals DATA_T may be input to the first buffers 115 of the first memory 110 via the PCB 150, the fourth vias 133 of the second memory 130, and the first vias 111 of the first memory 110.

In other words, the stacked layer type semiconductor device 100 may be formed so that the first memory 110 and the second memory 130 are stacked having their central axes face with each other crosswise and separated by a distance d, and that the first vias 111 and the second vias 113 of the first memory 110 face the third vias 131 and the fourth vias 133 of the second memory 130. Thus, even when the first and second data signals DATA_B and DATA_T are simultaneously received together with the access signals AC_B or AC_T from the external source via the PCB 150, the first memory 110 and the second memory 130 may be able to receive corresponding data signals.

Sub vias formed in the first memory 110 and the second memory 130, namely, the second vias 113 of the first memory 110 and the fourth vias 133 of the second memory 130, may be formed adjacent to main vias formed in the first memory 110 and the second memory 130, namely, the first vias 111 of the first memory 110 and the third vias 131 of the second memory 130. The number of sub vias formed adjacent to the first vias 111 of the first memory 110 and the third vias 131 of the second memory 130 may be N−1 (where N is the number of stacked memories).

Referring back to FIG. 1, the first memory 110 and the second memory 130 may be packaged by being sealed with the package mold 170, such as, Epoxy Molding Compound (EMC), covering the PCB 150. The first memory 110 and the second memory 130 may be implemented as a package such as a Package On Package (PoP), Ball Grid Arrays (BGAs), Chip Scale Packages (CSPs), a Plastic Leaded Chip Carrier (PLCC), a Plastic Dual In-Line Package (PDIP), a Die in Waffle Pack, a Din in Wafer Form, a Chip On Board (COB), a CERamic Dual In-Line Package (CERDIP), a plastic metric quad flat pack (MQFP), a Thin Quad FlatPack (TQFP), a small outline (SOIC), a shrink small outline package (SSOP), a thin small outline (TSOP), a system in package (SIP), a multi chip package (MCP), a wafer-level fabricated package (WFP), or a wafer-level processed stack package (WSP). These exemplary packages are not intended to be limiting; other packages may be implemented.

Figure 3:
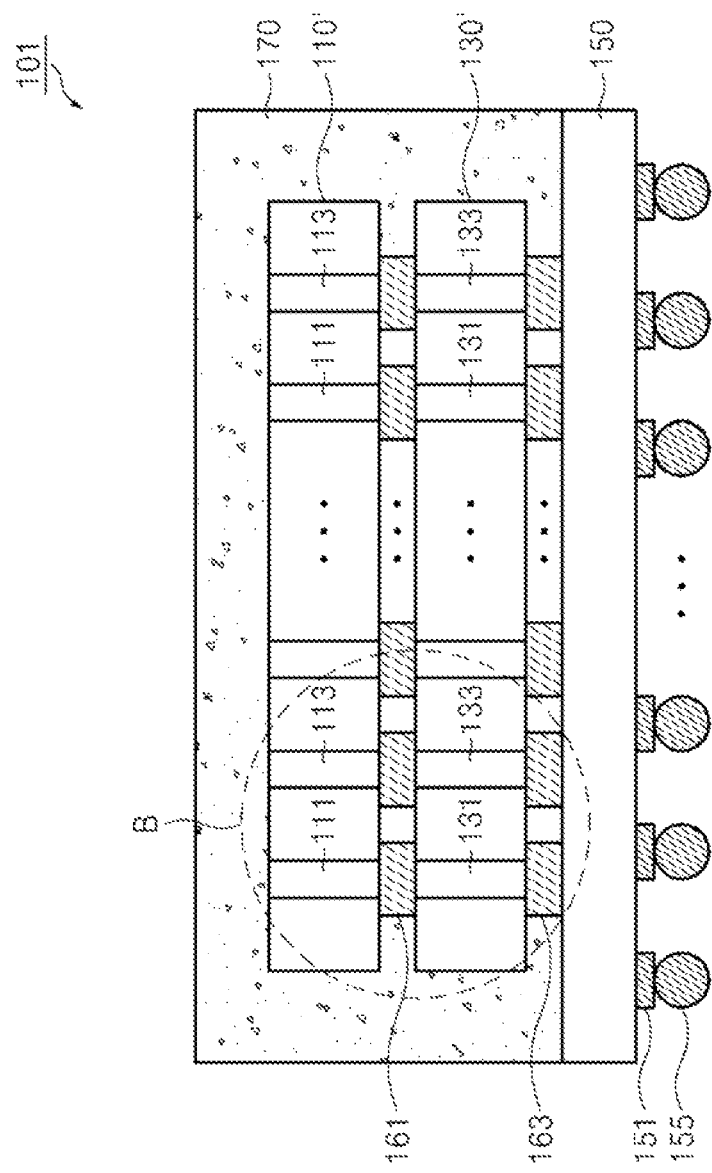
FIG. 3 is a schematic cross-sectional view of a stacked layer type semiconductor device according to another exemplary embodiment of the present invention.
Figure 4:
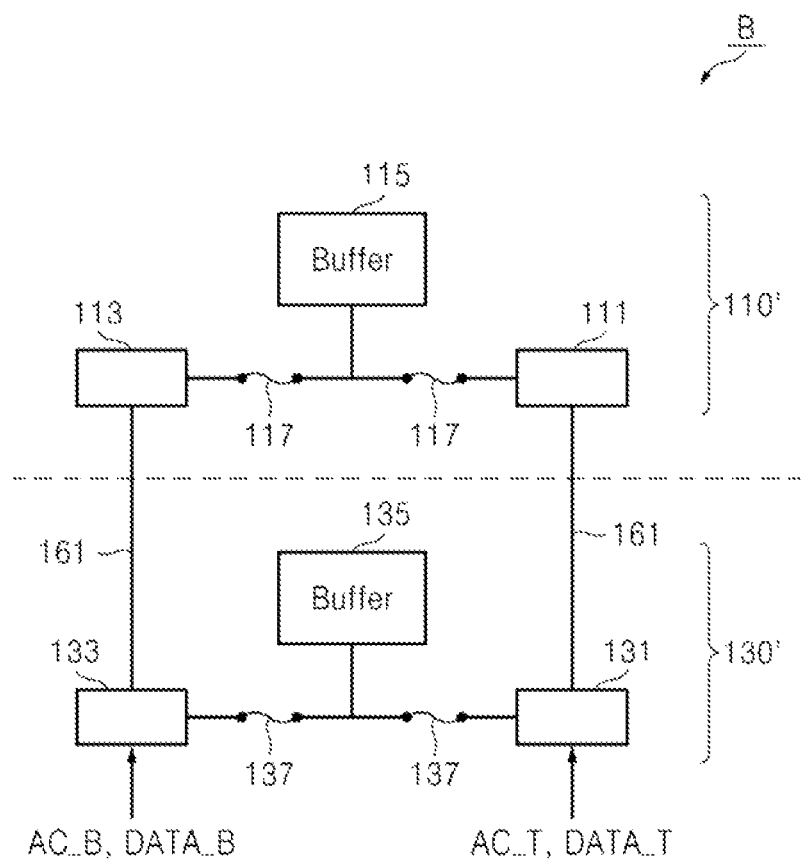
FIG. 4 is a schematic block diagram of a portion B of the stacked layer type semiconductor device illustrated in FIG. 3, according to an exemplary embodiment of the present invention.
Figure 5:
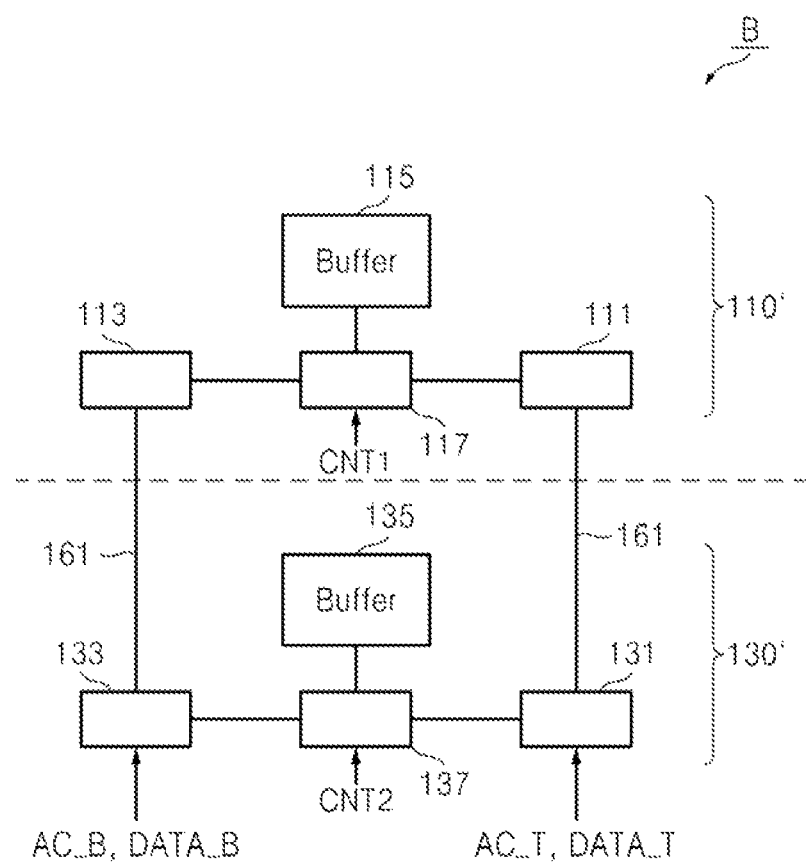
FIG. 5 is a schematic block diagram of a portion B of the stacked layer type semiconductor device of FIG. 3, according to another exemplary embodiment of the present invention.
Figure 6:
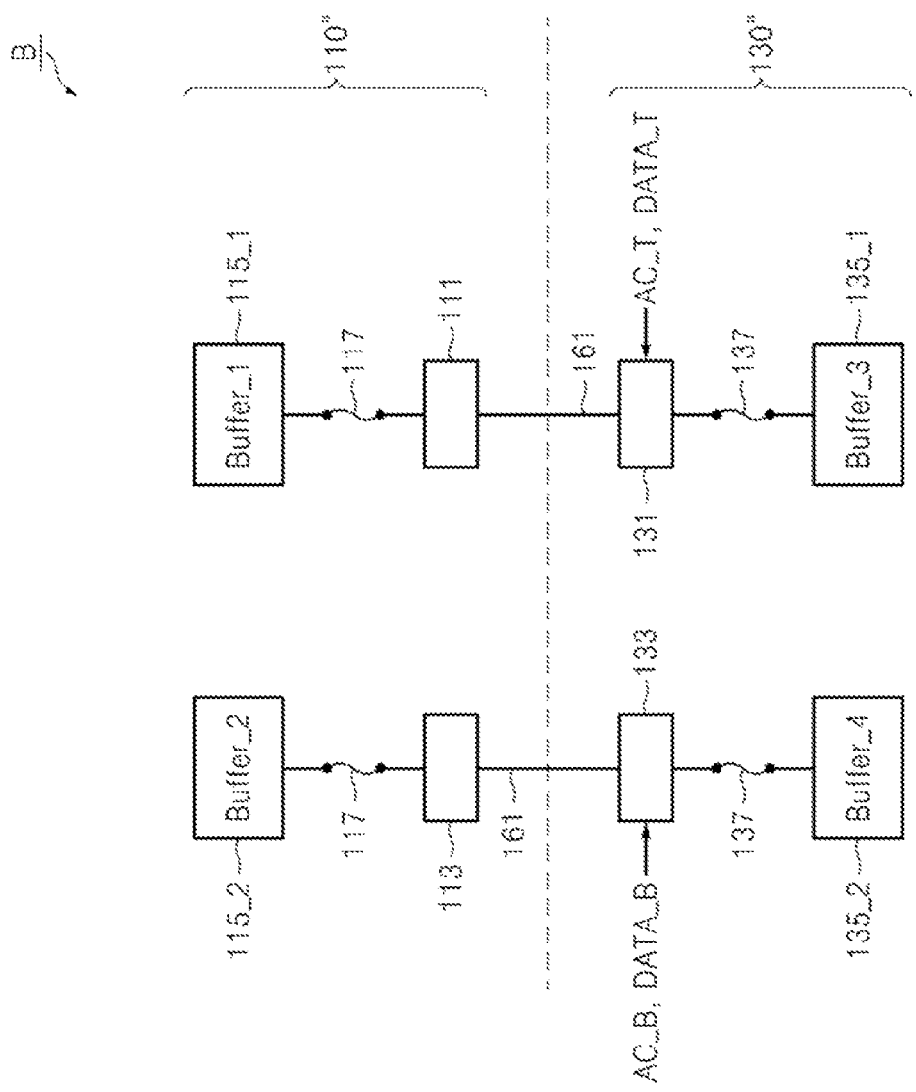
FIG. 6 is a schematic block diagram of a portion B of the stacked layer type semiconductor device of FIG. 3, according to another exemplary embodiment of the present invention.

FIG. 3 is a schematic cross-sectional view of a stacked layer type semiconductor device 101 according to another exemplary embodiment of the present invention. FIG. 4 is a schematic block diagram of a portion B of the stacked layer type semiconductor device 101, according to an exemplary embodiment of the present invention. FIG. 5 is a schematic block diagram of a portion B of the stacked layer type semiconductor device 101, according to another exemplary embodiment of the present invention. FIG. 6 is a schematic block diagram of a portion B of the stacked layer type semiconductor device 101, according to another exemplary embodiment of the present invention.

For convenience of explanation, the same reference numerals as those of FIGS. 1 and 2 denote the same elements in FIGS. 3-6, and thus a detailed description thereof will be omitted.

Referring to FIG. 3, the stacked layer type semiconductor device 101 may include the PCB 150, a first memory 110', and a second memory 130'. The first memory 110' and the second memory 130' may be packaged by being sealed with the package mold 170.

The PCB 150 may be located below the stacked layer type semiconductor device 101 and may be connected (or mounted) to (or on) the outside, for example, an external PCB (not shown). The first memory 110' and the second memory 130' may be sequentially stacked on the PCB 150.

The first memory 110' may include the first vias 111 and the second vias 113, and the second memory 130' may include the third vias 131 and the fourth vias 133. The first vias 111 and the third vias 131 may be main vias, and the second vias 113 and the fourth vias 133 may be sub vias. The first through fourth vias 111 through 133 may be TSVs.

The first vias 111 of the first memory 110' may be connected to the third vias 131 of the second memory 130' via the first connection terminals 161, and the second vias 113 of the first memory 110' may be connected to the fourth vias 133 of the second memory 130' via the first connection terminals 161. The third vias 131 and the fourth vias 133 of the second memory 130' may be connected to the PCB 150 via the second connection terminals 163.

Referring to FIGS. 3 and 4, the first memory 110' and the second memory 130' in the portion B may include first and second buffers 115 and 135, respectively, and selection circuits 117 and 137, respectively. Each of the selection circuits 117 and 137 may be a circuit capable of selecting a transmission path for the access signal AC_B or AC_T and the data signal DATA_B or DATA_T received from the external source.

For example, at least one first selection circuit 117 may be located between the first buffer 115, a first via 111, and a second via 113 of the first memory 110'. At least one second selection circuit 137 may be located between the second buffer 135, a third via 131, and a fourth via 133 of the second memory 130'. The first and second selection circuits 117 and 137 may be fuses or anti-fuses. According to an exemplary embodiment, the first and second selection circuits 117 and 137 are fuses.

The first selection circuit 117 and the second selection circuit 137 may be fused and opened according to a selected transmission path, before the first memory 110' and the second memory 130' are stacked. For example, the first selection circuit 117 located between the first buffer 115 and the second via 113 may be fused and opened, and the second selection circuit 137 located between the second buffer 135 and the third via 113 may be fused and opened.

Accordingly, the fused and opened first selection circuit 117 may select a transmission path in which the first access signal AC_B and the first data signal DATA_B received by the fourth via 133 of the second memory 130' from the external source via the PCB 150 are input to the second buffer 135 via the fourth via 133 of the second memory 130'. The fused and opened second selection circuit 137 may select a transmission path in which the second access signal AC_T and the second data signal DATA_T received by the third via 131 of the second memory 130' from the external source via the PCB 150 are input to the first buffer 115 via the third via 131 of the second memory 130' and the first via 111 of the first memory 110'.

Referring to FIGS. 3 and 5, a first selection circuit 117 and a second selection circuit 137 may be MUXes (multiplexers) that are switched on according to first and second control signals CNT1 and CNT2, respectively, received from an external source.

For example, the first selection circuit 117 may be located between the first buffer 115, the first via 111, and the second via 113 of a first memory 110' and may select a transmission path for the access signal AC_B or AC_T and the data signal DATA_B or DATA_T received from the external source according to the first control signal CNT1. The second selection circuit 137 may be located between the second buffer 135, the third via 131, and the fourth via 133 of a second memory 130' and may select the transmission path for the access signal AC_B or AC_T and the data signal DATA_B or DATA_T received from the external source according to the second control signal CNT2.

Accordingly, the second selection circuit 137 switched on according to the second control signal CNT2 may select a transmission path in which the first access signal AC_B and the first data signal DATA_B received by the fourth via 133 of the second memory 130' from the external source via the PCB 150 are input to the second buffer 135 via the fourth via 133 of the second memory 130'. The first selection circuit 117 switched on according to the first control signal CNT1 may select a transmission path in which the second access signal AC_T and the second data signal DATA_T received by the third via 131 of the second memory 130' from the external source via the PCB 150 are input to the first buffer 115 via the third via 131 of the second memory 130' and the first via 111 of the first memory 110'.

Referring to FIGS. 3 and 6, each of a first memory 110" and a second memory 130" in the portion B may include a plurality of buffers. For example, the first memory 110" may include a first buffer 115_1 connected to the first via 111 and a second buffer 115_2 connected to the second via 113, and the second memory 130" may include a third buffer 135_1 connected to the third via 131 and a fourth buffer 135_2 connected to the fourth via 133.

The first memory 110" and the second memory 130" in the portion B may include first selection circuits 117 and second selection circuits 137, respectively. Each of the first and second selection circuits 117 and 137 may be a fuse capable of selecting a transmission path for the access signal AC_B or AC_T and the data signal DATA_B or DATA_T received from the external source.

For example, the first-selection circuits 117 may be located between the first buffer 115_1 and the first via 111 of the first memory 110" and between the second buffer 115_2 and the second via 131 of the first memory 110", respectively. The second selection circuits 137 may be located between the third buffer 135_1 and the third via 131 of the second memory 130" and between the fourth buffer 135_2 and the fourth via 133 of the second memory 130", respectively.

The first selection circuits 117 and the second selection circuits 137 may be fused and opened according to a selected transmission path, before the first memory 110" and the second memory 130" are stacked. For example, the first selection circuit 117 located between the second buffer 115_2 and the second via 113 of the first memory 110" may be fused and opened, and the second selection circuit 137 located between the third buffer 135_1 and the third via 131 of the second memory 130" may be fused and opened.

Accordingly, the fused and opened first selection circuit 117 may select a transmission path in which the first access signal AC_B and the first data signal DATA_B received by the fourth via 133 of the second memory 130" from the external source via the PCB 150 are input to the fourth buffer 135_2 via the fourth via 133 of the second memory 130". The fused and opened second selection circuit 137 may select a transmission path in which the second access signal AC_T and the second data signal DATA_T received by the third via 131 of the second memory 130" from the external source via the PCB 150 are input to the first buffer 115_1 via the third via 131 of the second memory 130" and the first via 111 of the first memory 110".

In other words, the stacked layer type semiconductor device 101 according to exemplary embodiments described above with reference to FIGS. 3 through 6 include the at least one selection circuit 117 or 137 in the first memory 110' or 110" and the second memory 130' or 130", respectively. Thus, when the first data signal DATA_B and the second data signal DATA_T are simultaneously received together with the access signal AC_B or AC_T from an external source via the PCB 150, corresponding data signals may be provided to the first memory 110 and the second memory 130 according to the selection circuit 117 or 137.

The stacked layer type semiconductor device 101 of FIG. 5 may further include a control signal (not shown) for providing the first or second control signal CNT1 or CNT2, in the selection circuit 117 or 137.

Figure 7:
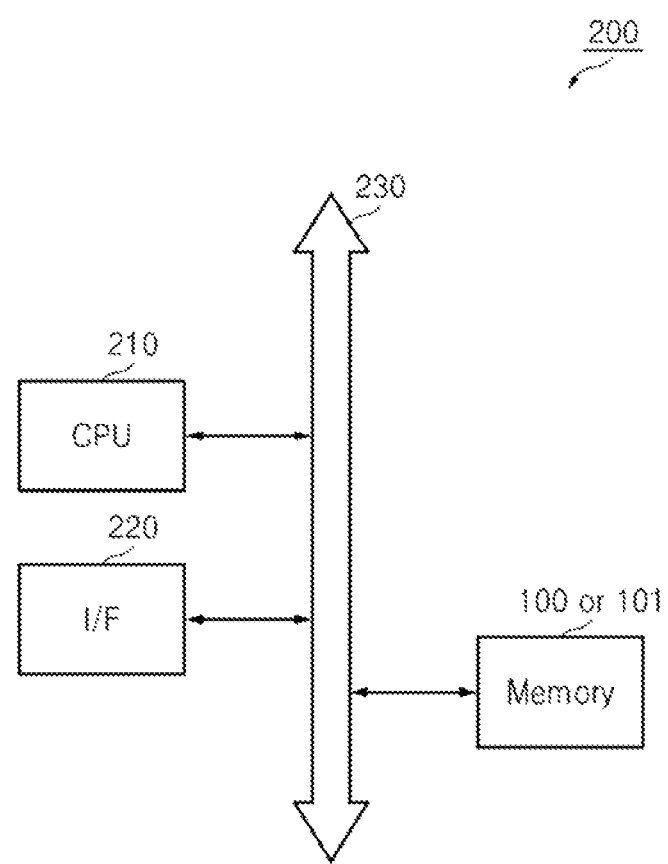
FIG. 7 is a schematic block diagram of a semiconductor system including a stacked layer type semiconductor device, according to an exemplary embodiment of the present invention.

FIG. 7 is a schematic block diagram of a semiconductor system 200 including a stacked layer type semiconductor device, according to an exemplary embodiment of the present invention. For convenience of explanation, a memory system that uses a stacked layer type semiconductor device as memory is illustrated in FIG. 7, but the present invention is not limited thereto.

A memory system may be used in computer systems, terminal equipment systems, input/output device systems, Hard Disk Drive (HDD) recorders, terminals such as cellular phones and Personal Digital Assistants (PDAs), computers (Personal Computers (PCs), laptop PCs, notebooks, etc.), navigator devices, home automation systems, music players (mp3 players, etc.), camcorders, image players (DVIX players, etc.), storage severs, Potable Multimedia Players (PMPs), Solid State Drives/Disks (SSDs), memory cards, smart cards, etc.

Referring to FIG. 7, the semiconductor system 200 may include a memory 100 or 101, a central processing unit (CPU) 210, and an interface (I/F) 220. The memory 100 or 101 is the stacked layer type semiconductor device 100 or 101 described above with reference to FIGS. 1 through 6, and thus a detailed description thereof will be omitted.

The CPU 210 may generate a control signal, for example, an access signal, capable of controlling operations of the memory 100 or 101 and the I/F 220, and output the access signal to the memory 100 or 101 and the I/F 220 via a bus 230. The I/F 220 may be a wired or wireless input/output interface and may transmit a data signal received from an external source to the memory 100 or 101 or output data stored in the memory 100 or 101 to the outside according to the access signal output from the CPU 210.

In a stacked layer type semiconductor device and a semiconductor system including the same, according to an exemplary embodiment of the present invention, a plurality of memories are sequentially stacked without using wires, so that the processing speed of the semiconductor device increases and the size of the entire package of the semiconductor device decreases.

While the present invention has been particularly shown and described with reference to exemplary embodiments thereof, it will be understood that various changes in form and details may be made therein without departing from the spirit and scope of the following claims.

What is claimed is:

1. A stacked layer type semiconductor device comprising:
a printed circuit board (PCB) substrate receiving a first access signal, a second access signal, a first data signal, and a second data signal from an external source;
a second memory mounted on the PCB, the second memory including a third through-silicon via (TSV) receiving the first access signal and the first data signal from the PCB, a fourth TSV receiving the second access signal and the second data signal from the PCB, and a second memory buffer directly connected to the third via and receiving the first access signal and the first data signal therethrough; and
a first memory mounted on the second memory, the first memory including a second TSV directly connected to the third TSV, a first TSV directly connected to the fourth TSV, and a first memory buffer directly connected to the first TSV and receiving the second access signal and the second data signal therethrough,
wherein the second memory buffer is not connected to the first TSV and does not receive the second access signal or the second data signal, and the first memory buffer is not connected to the third via and does not receive the first access signal or the first data signal.

2. The stacked layer type semiconductor device of claim 1, additionally comprising an additional memory mounted on the first memory, the additional memory including an additional TSV directly connected to the second TSV, and an additional memory buffer receiving the first access signal and the first data signal from the additional TSV.

3. The stacked layer type semiconductor device of claim 1, additionally comprising at least one additional memory mounted over the first memory, each of the at least one additional memories having a structure substantially identical to either the first or second memory.

4. The stacked layer type semiconductor device of claim 3, wherein the at least one additional memories having a structure substantially identical to the first and second memories are alternately arranged.

5. The stacked layer type semiconductor device of claim 1, communicatively coupled to a central processing unit (CPU) for outputting the first and second access signals, wherein the stacked layer type semiconductor device performs an access operation according to the first and second access signals provided from the CPU.

6. The stacked layer type semiconductor device of claim 1, wherein the fourth TSV is not connected to a memory buffer of the second memory.

7. The stacked layer type semiconductor device of claim 1, wherein the second TSV is not connected to a memory buffer of the first memory.

8. The stacked layer type semiconductor device of claim 1, wherein the first and second memories are stacked such that central axes of the first and second memories face each other crosswise.

9. The stacked layer type semiconductor device of claim 1, wherein the first, second, third, and forth TSVs each include a corresponding connection terminal.

10. The stacked layer type semiconductor device of claim 1, wherein the first memory buffer is a buffer for performing read/write operations for the first memory according to the second access signal and the second memory buffer is a buffer for performing read/write operations for the second memory according to the first access signal.

* * * * *